United States Patent
Kishimoto et al.

(10) Patent No.: US 7,927,455 B2
(45) Date of Patent: Apr. 19, 2011

(54) PLASMA PROCESSING APPARATUS

(75) Inventors: Katsushi Kishimoto, Soraku-gun (JP); Yuhsuke Hukuoka, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 1133 days.

(21) Appl. No.: 11/252,885

(22) Filed: Oct. 19, 2005

(65) Prior Publication Data
US 2006/0087211 A1     Apr. 27, 2006

(30) Foreign Application Priority Data
Oct. 22, 2004 (JP) .................. 2004-308370

(51) Int. Cl.
C23C 16/00 (2006.01)
C23F 1/00 (2006.01)
H01L 21/306 (2006.01)
H05B 31/26 (2006.01)

(52) U.S. Cl. .......... 156/345.43; 118/723 E; 156/345.44; 156/345.47; 315/111.21

(58) Field of Classification Search ............ 118/723 E; 156/345.43, 345.44, 345.47
See application file for complete search history.

(56) References Cited

U.S. PATENT DOCUMENTS

| | | | |
|---|---|---|---|
| 4,264,393 A | 4/1981 | Gorin et al. | |
| 4,287,851 A | 9/1981 | Dozier | |
| 4,292,153 A | 9/1981 | Kudo et al. | |
| 4,381,965 A * | 5/1983 | Maher et al. ............ | 156/345.45 |
| 4,623,441 A * | 11/1986 | Fazlin .................... | 204/298.39 |
| 4,633,811 A | 1/1987 | Maruyama | |
| 4,664,890 A | 5/1987 | Tawada et al. | |
| 4,676,865 A | 6/1987 | DeLarge | |
| 4,825,806 A | 5/1989 | Tawada et al. | |
| 4,887,005 A | 12/1989 | Rough et al. | |
| 5,041,201 A | 8/1991 | Yamazaki et al. | |
| 5,061,359 A | 10/1991 | Babu et al. | |
| 5,082,547 A | 1/1992 | DeLarge | |
| 5,515,986 A | 5/1996 | Turlot et al. | |
| 5,653,810 A | 8/1997 | Kataoka et al. | |
| 5,753,886 A * | 5/1998 | Iwamura et al. ......... | 219/121.43 |
| 5,795,452 A | 8/1998 | Konoshita et al. | |
| 5,958,141 A | 9/1999 | Kitabatake et al. | |
| 6,017,396 A | 1/2000 | Okamoto | |
| 6,189,485 B1 | 2/2001 | Matsuda et al. | |

(Continued)

FOREIGN PATENT DOCUMENTS
EP     0 689 226 A1    12/1995
(Continued)

OTHER PUBLICATIONS

European Search Report mailed May 12, 2006 in EP application No. 06000503.0.

(Continued)

*Primary Examiner* — Parviz Hassanzadeh
*Assistant Examiner* — Rakesh Dhingra
(74) *Attorney, Agent, or Firm* — Nixon & Vanderhye, P.C.

(57) ABSTRACT

A plasma processing apparatus including a sealable chamber that is sealable, a gas supply section that supplies a reactive material gas into the chamber, and a plurality of cathode and anode electrode pairs provided within the chamber, connected to an external power supply, and producing plasma discharges through the material gas, respectively, wherein the plurality of cathode and anode electrode pairs are provided at a distance from one another at which the plasma discharges are prevented from interfering with one another.

13 Claims, 6 Drawing Sheets

U.S. PATENT DOCUMENTS

| | | |
|---|---|---|
| 6,349,670 B1 | 2/2002 | Nakano et al. |
| 2003/0155332 A1 | 8/2003 | Datta et al. |
| 2003/0164143 A1 | 9/2003 | Toyoda et al. |
| 2004/0187785 A1 | 9/2004 | Kishimoto et al. |
| 2006/0151319 A1 | 7/2006 | Kishimoto et al. |
| 2006/0191480 A1 | 8/2006 | Kishimoto et al. |

FOREIGN PATENT DOCUMENTS

| | | |
|---|---|---|
| JP | 54-106081 A | 8/1979 |
| JP | 60-924 U | 1/1985 |
| JP | 61-214513 A | 9/1986 |
| JP | 4-164895 | 6/1992 |
| JP | 5-283343 A | 10/1993 |
| JP | 6-136542 A | 5/1994 |
| JP | 9-209151 A | 8/1997 |
| JP | 2000-294511 A | 10/2000 |
| JP | 2001-77091 A | 3/2001 |
| JP | 2001-85409 A | 3/2001 |
| JP | 2004-259853 A | 9/2004 |
| WO | 2005/045873 A2 | 5/2005 |

OTHER PUBLICATIONS

Patent Abstracts of Japan, vol. 009, No. 143 (E-322) Jun. 18, 1985 & JP 60 025235 A (Hitachi Seisakusho KK), Feb. 8, 1985.

European Search Report mailed Jun. 1, 2006 in EP Application No. 06000502.2.

U.S. Office Action mailed Jun. 28, 2007 in U.S. Appl. No. 11/328,448.

U.S. Final Office Action mailed Dec. 14, 2007 in U.S. Appl. No. 11/328,448.

U.S. Office Action mailed Oct. 5, 2007 in U.S. Appl. No. 10/787,748.

* cited by examiner

PLASMA PROCESSING APPARATUS

CROSS-REFERENCE TO RELATED APPLICATION

This application is related to Japanese application No. 2004-308370 filed on Oct. 22, 2004, the disclosure of which is incorporated by reference in its entirety.

BACKGROUND OF THE INVENTION

1. Field of the Invention

The present invention relates to a plasma processing apparatus. In particular, the present invention relates to a plasma processing apparatus that is used to manufacture a semiconductor device by a technique such as etching a substrate, which is a processing target, or forming a film on the substrate by plasma discharge of a reactive material gas in a sealable chamber, and that is configured so that a plurality of pairs of a cathode electrode and an anode electrode for producing the plasma discharge are disposed in the chamber.

2. Description of the Related Art

U.S. Pat. No. 4,264,393 shows an example conventional plasma processing apparatus for improving etching performance or deposition uniformity according to a plasma chemical technique.

FIG. 7 shows one type of conventional plasma processing apparatus known as a vertical type semiconductor device.

In the semiconductor device manufacturing apparatus shown in FIG. 7, a sealable vertical chamber 11 serves as a reaction container. Anode electrodes 4 are disposed generally perpendicularly to a bottom of the chamber 11 at a central portion of the chamber 11. Each anode electrode 4 is in contact with a heater 14 provided generally perpendicularly to the bottom of the chamber 11 in the central portion of the chamber 11. This heater 14 heats a glass substrate 1 (held by a substrate holding section 15), which is a processing target, to ascertain temperature, e.g., 100° C. to 600° C. This semiconductor device manufacturing apparatus also includes cathode electrodes 2 which are positioned closer to sidewalls of the chamber 11, and which are generally perpendicularly to the bottom of the chamber 10 within the chamber 10.

In the semiconductor device manufacturing apparatus of FIG. 7, anode electrodes 4 and cathode electrodes 2 are arranged to put the cathode electrodes 2 between the anode electrodes 4 (in a state in which two of cathode and anode electrode pairs 7 face each other) at predetermined distances in a horizontal direction. In addition, the semiconductor device manufacturing apparatus of FIG. 7 is configured to produce plasma discharge between the anode electrodes 4 and the cathode electrodes 2, respectively.

The chamber 11 and the anode electrodes 4 consist of stainless steel, aluminum alloy or the like, and ceramics or the like (used as a heat insulating material). Each of the cathode electrodes 2 is arranged to face the substrate 1 at a predetermined distance. Each of the cathode electrodes 2 is supported by a cathode support 5 consisting of insulating glass so as to ensure electrical insulation. The heater 14 is grounded through a grounding terminal 20.

The conventional plasma processing apparatuses have the following disadvantages.

The disadvantages of the apparatus disclosed in the U.S. Pat. No. 4,264,393 will first be described. In this apparatus, a substrate is disposed without distinguishing cathode electrodes from anode electrodes, and a plasma discharge is produced between all adjacent electrodes. Due to this, in terms of film formation, films formed on the cathode electrodes and those formed on the anode electrodes are mixed together. In terms of etching, the substrate etched on the cathode electrodes and that etched on the anode electrodes are mixed up.

Such mixing is not desirable because this disadvantageously results in use of lower-quality films formed on the cathode electrodes and a process onto the anode electrodes unsuited for etching.

In this apparatus, since the distances between the adjacent electrodes are all equal, there is no avoiding producing the plasma discharge, but it is still possible not to use the lower-quality films formed on the cathode electrodes and the process onto the anode electrodes unsuited for etching. Nevertheless, adjacent plasmas interfere with each other because the discharge itself cannot be inhibited, and this results in that the discharge is disadvantageously quite unstable.

The disadvantages of the semiconductor device manufacturing apparatus shown in FIG. 7 will next be described. In the apparatus shown in FIG. 7, it is necessary to control the plasma discharges produced between the two cathode and anode electrode pairs 7 independently of each other so as to provide films uniform in thickness and quality between the respective cathode and anode electrode pairs 7. This disadvantageously requires a wall (corresponding to the heater 14 disposed in the central portion in this example) to prevent the interference of plasmas between the anode electrodes 4. As a result, a configuration of the apparatus is disadvantageously complicated.

Furthermore, if a high frequency power supply such as a radio frequency (RF) power supply is employed in a large-sized apparatus, it is quite difficult to keep the two proximate anode electrodes 4 equal in potential because of radio frequency characteristics (for example, to sufficiently ground them). Due to this, the two proximate anode electrodes 4 tend to interfere with each other, disadvantageously resulting in unstable discharge.

To minimize the influence of the interference, it is necessary to provide an earth wall (the heater 14 in this example) to prevent the interference of plasmas. In this case, the chamber 11 is made large in size, disadvantageously resulting in great cost increase.

BRIEF SUMMARY

A plasma processing apparatus is configured so that a plurality of cathode and anode electrode pairs are disposed facing the same direction within one chamber, which can provide a simple structure and ensure stable plasma discharge, and which can be manufactured at low cost.

A plasma processing apparatus according to an example embodiment includes a sealable chamber that is sealable; a gas supply section that supplies a reactive material gas into the chamber; and a plurality of cathode and anode electrode pairs provided within the chamber. The electrode pairs are connected to an external power supply, and produce plasma discharges through a material gas, respectively. The plurality of cathode and anode electrode pairs are provided at a distance from one another at which the plasma discharges are prevented from interfering with one another.

In the plasma processing apparatus according to an example embodiment a plurality of pairs of cathode and anode electrodes are provided to be distanced from each other so as to be able to prevent interference of plasmas. Thanks to this, even if a plurality of plasmas are present within one chamber, it is possible to prevent the plasmas from interfering with one another.

DESCRIPTION OF THE PREFERRED EMBODIMENTS

Figure 1:
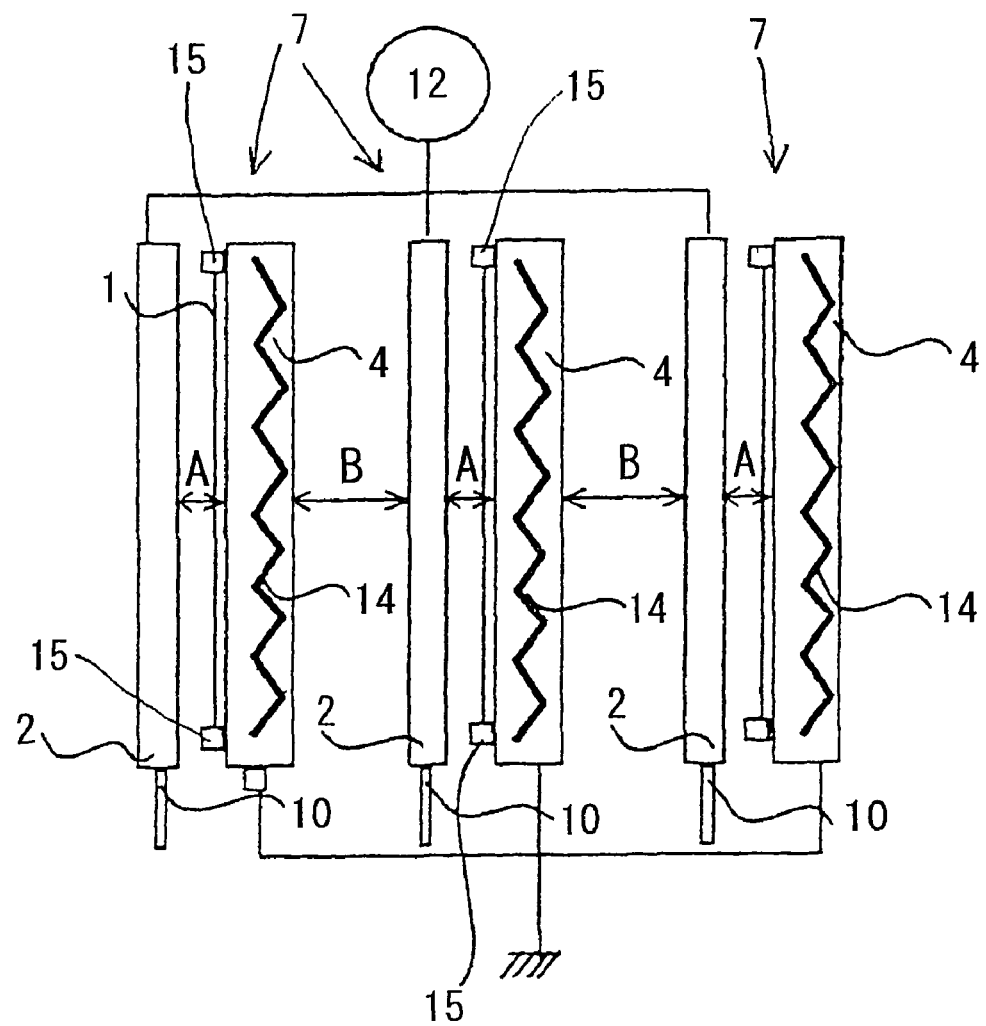
FIG. 1 is a schematic longitudinal sectional view of a plasma processing apparatus (with anodes grounded) according to a first example embodiment.

The plasma processing apparatus according to example embodiments, for example, is used to manufacture a semiconductor device in a manner that a substrate, which is a processing target, is disposed between a cathode electrode and an anode electrode in each cathode and anode electrode pair, and subjected to a plasma discharge processing.

In the plasma processing apparatus according to example embodiments, the plurality of cathode and anode electrode pairs are disposed, for example, in a manner that an anode electrode and a cathode electrode in each anode and cathode electrode pair are in a form of plates and in parallel to each other. Discharge surfaces of cathode electrodes in the respective anode and cathode electrode pairs are oriented in the same direction. A distance between the cathode electrode and the anode electrode in each anode and cathode electrode pair is a predetermined distance. A distance between a cathode electrode of one of the anode and cathode electrode pairs and an anode electrode of an anode and cathode electrode pair adjacent to the one of the anode and cathode electrode pairs is at least twice as large as the predetermined distance.

In this case, the predetermined distance is set according to, for example, a type and a supply rate of the reactive material gas, materials and dimensions of the cathode and anode electrode pairs, a material and dimensions of the processing target and the like. An example of this predetermined distance is from several millimeters to several tens of millimeters as described later in a first embodiment.

The reason that the two anode and cathode electrode pairs adjacent to each other are arranged so that the distance between the cathode electrode of one of the anode and cathode electrode pairs and the anode electrode of an adjacent anode and cathode electrode pair is at least twice as large as the predetermined distance is as follows. As a result of an experiment conducted by the inventors of the present invention, it is discovered that if the distance between the cathode electrode of one of the anode and cathode electrode pairs and the anode electrode of the adjacent anode and cathode electrode pair is less than twice as large as the predetermined distance, it is insufficient to prevent a plurality of plasmas from interfering with one another within the chamber.

However, there is an upper limit to the distance between the cathode electrode of one of the anode and cathode electrode pairs and the anode electrode of the adjacent anode and cathode electrode pair, which is twice as large as the predetermined distance. The upper limit is an appropriate value set according to the plasma processing apparatus, particularly, allowable dimensions of the chamber, efficiency of the plasma processing, a type of the substrate which is the processing target, a processing cost and the like.

In the plasma processing apparatus according to example embodiments, for example, the plurality of anode and cathode electrode pairs are disposed in series with the discharge surfaces of the cathode electrodes located generally perpendicularly to a bottom of the chamber.

In the plasma processing apparatus according to example embodiments, for example, the plurality of anode and cathode electrode pairs are disposed in series with the discharge surfaces of the cathode electrodes located generally horizontally and the cathode electrodes located at an upper side relative to the anode electrodes. In addition, if the substrate, which is the processing target, is mounted on an upper surface of each anode electrode, it is possible to obtain the plasma processing apparatus such as a CVD apparatus capable of sufficiently grounding the substrate on each anode electrode and including a plurality of plasma spaces.

In the plasma processing apparatus according to example embodiments, for example, the plurality of anode and cathode electrode pairs are disposed in series with the discharge surfaces of the cathode electrodes located generally horizontally and the cathode electrodes located at a lower side relative to the anode electrodes. In addition, if the substrate, which is the processing target, is mounted on an upper surface of each cathode electrode, it is possible to obtain the plasma processing apparatus such as a RIE apparatus capable of sufficiently grounding the substrate on each cathode electrode and including a plurality of plasma spaces.

In the plasma processing apparatus according to example embodiments, for example, the plurality of anode and cathode electrode pairs are disposed in parallel with the discharge surfaces of the cathode electrodes located generally horizontally, the cathode electrodes located at an upper side relative to the anode electrodes, and the cathode electrodes and the anode electrodes located on the same planes, respectively. If the cathode and anode electrode pairs are thus configured, it is possible to obtain the plasma processing apparatus such as a CVD apparatus capable of sufficiently grounding the substrate on each anode electrode, dividing the cathode electrode into a plurality of cathode electrodes on the same plane, and controlling the respective discharges independently of one another.

In the plasma processing apparatus according to example embodiments, for example, the plurality of anode and cathode electrode pairs are disposed in parallel with the discharge surfaces of the cathode electrodes located generally horizontally, the cathode electrodes located at a lower side relative to the anode electrodes, and the cathode electrodes and the anode electrodes located on the same planes, respectively. If the cathode and anode electrode pairs are thus configured, it is possible to obtain the plasma processing apparatus such as a RIE apparatus capable of sufficiently grounding the substrate on each cathode electrode, dividing the cathode electrode into a plurality of cathode electrodes on the same plane, and controlling the respective discharges independently of one another.

As a power supply for the plasma processing apparatus according to example embodiments, a power supply that generates a power at a frequency of, for example, 1 MHz to 60 MHz is used. In the plasma processing apparatus according to the present invention, the material gas contains, for example, monosilane, disilane, or germane, and a film is formed using the material gas. In this case, it is possible to obtain the CVD apparatus that forms an amorphous or a microcrystal silicon-containing film. If the material gas is diluted with inert gas or hydrogen gas, it is possible to improve a uniformity in such as thickness of a film formed by the CVD apparatus capable of controlling a plurality of discharges independently of one another.

In the plasma processing apparatus according to example embodiments, when the material gas contains hydrogen and fluorine-containing gas, an etching is performed by decomposition of this material gas. In this case, it is possible to provide an etching apparatus that can control a plurality of discharges independently of one another. If the material gas is diluted with inert gas, it is possible to improve a uniformity in such as an etch rate using the CVD apparatus capable of controlling a plurality of discharges independently of one another.

The present technology will be described hereinafter in detail with reference to three embodiments each of which shows two types of plasma processing apparatuses. It should be noted that the present invention is not limited to these embodiments.

First Embodiment

Figure 2:
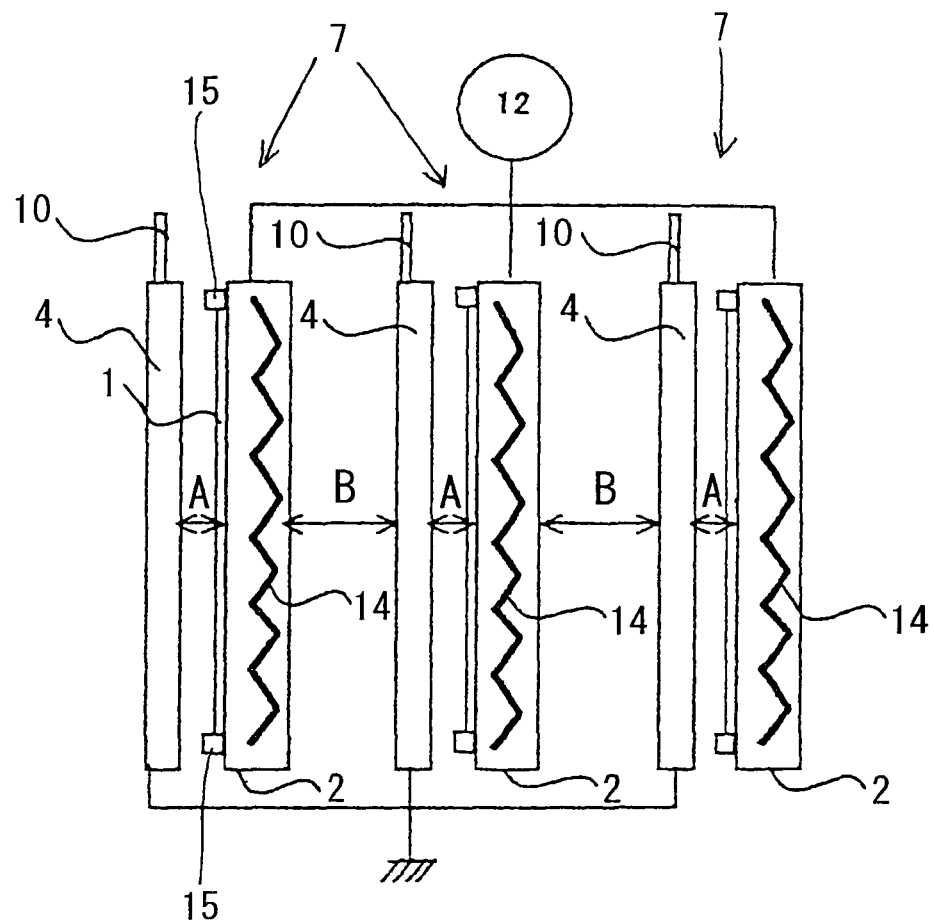
FIG. 2 is a schematic longitudinal sectional view of a plasma processing apparatus (with cathodes grounded) according to the first example embodiment.

FIGS. 1 and 2 are schematic longitudinal sectional views of plasma processing apparatuses according to a first example embodiment.

Each plasma processing apparatus includes a sealable chamber (not shown) that is sealable and accommodates substrates 1 which are processing targets, gas inlet tubes 10 serving as gas supply sections that supply a reactive material gas into this chamber, and three cathode and anode electrode pairs 7 that are disposed within the chamber and connected to an external power supply, and that is discharging plasmas through the material gas. Although FIGS. 1 and 2 show three cathode and anode electrode pairs 7 for simplification, the number of cathode and anode electrode pairs 7 is not limited to three.

In each of the cathode and anode electrode pairs 7, a cathode electrode 2 and an anode electrode 4 are in a form of plates and in parallel to each other. Discharge surfaces of the cathode electrodes 2 are oriented in the same direction (a right direction in FIG. 1 and a left direction in FIG. 2), and located generally perpendicularly to a bottom of the chamber. The anode and cathode electrode pairs 7 are provided in series equidistantly. The plurality of cathode and anode electrode pairs have an empty space between the adjacent cathode and anode electrode pairs.

Further, these cathode and anode electrode pairs 7 are arranged as follows. Taking two cathode and anode electrode pairs 7 adjacent to each other, a distance B between the cathode electrode 2 of one of the cathode and anode electrode pair 7 and the anode electrode 4 of the adjacent the cathode and anode electrode pair 7 is twice as large as a distance A between the cathode electrode 2 and anode electrode 4 of each cathode and anode electrode pair 7.

FIG. 1 depicts an example in which each substrate 1 is disposed on a left surface of each anode electrode 4 using a substrate holding section 15. Each anode electrode 4 comprises a conductive and heat-resistant material such as stainless steel, aluminum alloy or carbon. The substrate 1 is normally a silicon substrate, a glass substrate or the like. However, the substrate 1 is not limited thereto. In the first embodiment, a glass substrate is used as the substrate 1.

Dimensions of each anode electrode 4 are set to appropriate values according to dimensions of the glass substrate 1 on which a thin film is formed. In this example, the dimensions of the anode electrode 4 are set to 1000 mm to 1500 mm by 600 mm to 1000 mm while those of the glass substrate 1 are 900 mm to 1200 mm by 400 mm to 900 mm.

Each anode electrode 4 includes therein a heater 14. This heater 14 controls the anode electrode 4 to be heated from a room temperature to 300° C. In this example, the anode electrode 4 has a closed heating unit such as a sheath heater and a closed temperature sensor such as a thermocouple included in aluminum alloy.

Each cathode electrode 2 comprises stainless steel, aluminum alloy or the like. In this example, each cathode electrode 2 comprises aluminum alloy. Dimensions of each cathode electrode 2 are set to appropriate values according to dimensions of the substrate 1 for forming a thin film. In this example, dimensions of the cathode electrode 2 are 1000 mm to 1500 mm by 600 mm to 1000 mm.

An interior of each cathode electrode 2 is a cavity. The material gas is introduced into this cavity through the gas inlet tube 10. As the material gas, $SiH_4$ (monosilane) diluted with. $H_2$ is used in this example.

Many through holes for supplying the material gas to a surface of the substrate 1 are formed on one surface of each cathode electrode 2 by punching. This punching is preferably conducted to form circular holes each having a diameter of 0.1 mm to 2 mm at pitches of several millimeters to several centimeters.

The distance A between the cathode electrode 2 and the anode electrode 4 is preferably from several millimeters to several tens of millimeters, and set to 2 mm to 30 mm in this example. In addition, in-plane distance accuracy is preferably within several %. In this example, it is confirmed that the in-plane distance accuracy is equal to or smaller than 1%.

Power is supplied from an external plasma excitation power supply 12 to each cathode electrode 2. The plasma excitation power supply 12 employs the power of 10 W to 100 kW at an AC frequency of 1.00 MHz to 60 MHz. In this example, the power of 10 W to 10 kW at 13.56 MHz to 60 MHz is used.

In the plasma processing apparatus thus configured, the material gas is filled up into a gap between each cathode electrode 2 and each anode electrode 4 at a predetermined flow rate and a predetermined pressure, and a RF power is applied to the cathode electrode 2 and the anode electrode 4, thereby producing a glow discharge region (plasma discharge region) between the cathode electrode 2 and the anode electrode 4. As a result, an amorphous film or a crystalline film can be formed on each substrate 1.

More specifically, by using the $SiH_4$ gas diluted with $H_2$ as the material gas, a silicon thin film having a thickness of 300 nm can be deposited in a range from −10% to 10% of a thickness distribution.

According to the plasma processing apparatus according to the first embodiment thus configured, the plasma processing apparatus capable of preventing plasmas from interfering with one another even if a plurality of plasmas are present within one chamber can be provided. It is thereby possible to efficiently obtain a semiconductor device such as a solar battery, a TFT, a photosensitive body or the like using a semiconductor thin film or an optical thin film at low cost.

FIG. 2 depicts an example in which each substrate 1 is disposed on a left surface of each cathode electrode 2 using the substrate holding section 15. This plasma processing apparatus is an etching apparatus, and fluorine-containing material gas diluted with inert gas such as argon is used. The power supply employs a power of 10 W to 100 kW at an AC frequency of 1.00 MHz to 60 MHz. In this example, the power of 10 W to 10 kW at 13.56 MHz to 60 MHz is used.

An interior of each anode electrode 4 is a cavity. The material gas is introduced into this cavity through the gas inlet tube 10. As the material gas, $NF_3$ diluted with Ar is used in this example.

Many through holes for supplying the material gas to the surface of the substrate 1 are formed on one surface of each anode electrode 4 by punching. This punching is preferably conducted to form circular holes each having a diameter of 0.1 mm to 2 mm at pitches of several millimeters to several centimeters.

The distance between the cathode electrode 2 and the anode electrode 4 is preferably several millimeters to several tens of millimeters, and set to 2 mm to 30 mm in this example. In addition, in-plane distance accuracy is preferably within several %. In this example, it is confirmed that the in-plane distance accuracy is equal to or smaller than 1%.

As a result of thus configuring the apparatus, a silicon film on each substrate 1 can be etched at an etch rate equal to or higher than 10 nm/s. It is thereby possible to obtain the plasma processing apparatus capable of preventing plasmas from interfering with one another even if a plurality of plasmas are present within one chamber. In addition, dry etching can be efficiently performed on a plurality of films.

Second Embodiment

Figure 3:
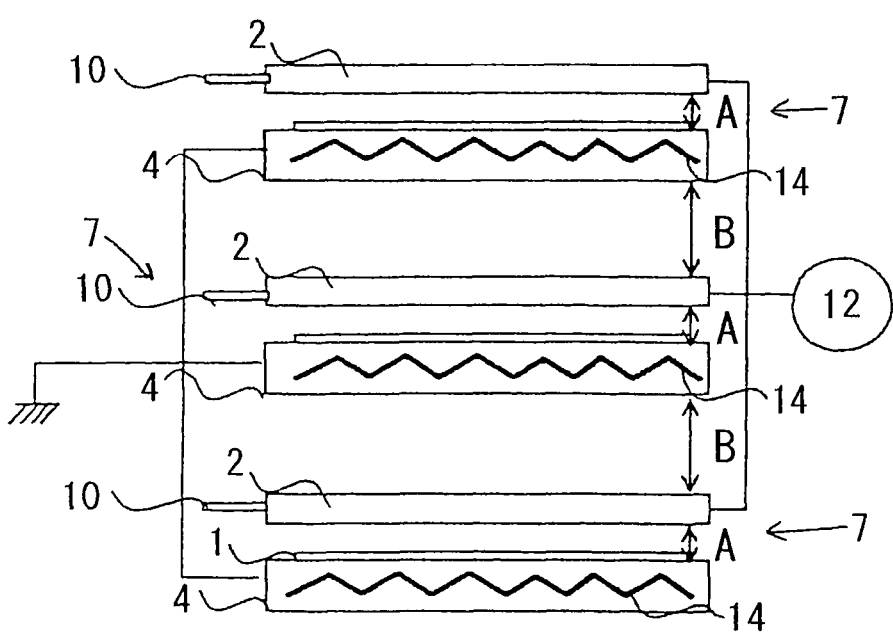
FIG. 3 is a schematic longitudinal sectional view of a plasma processing apparatus (with anodes grounded) according to a second example embodiment.
Figure 4:
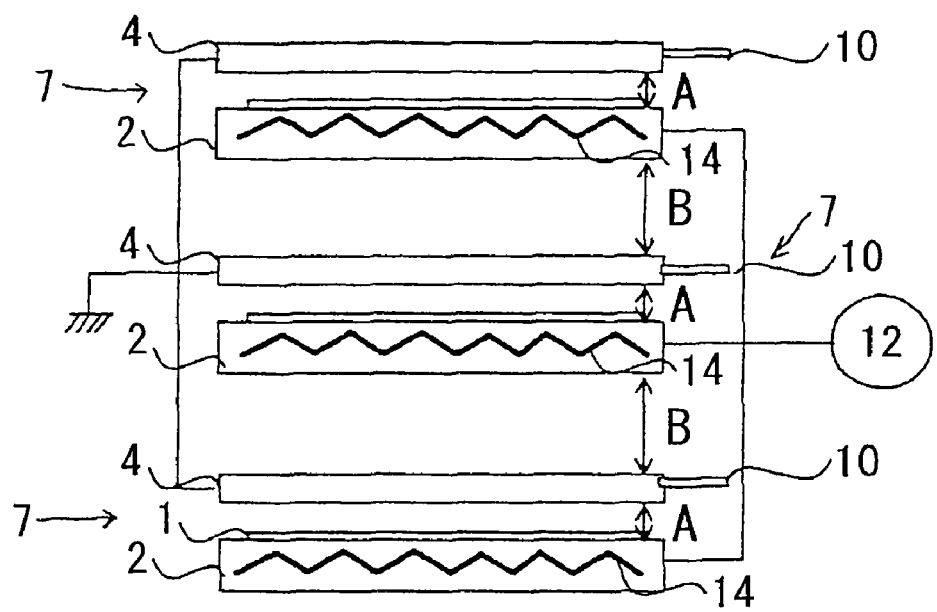
FIG. 4 is a schematic longitudinal sectional view of a plasma processing apparatus (with cathodes grounded) according to the second example embodiment.

FIGS. 3 and 4 are schematic longitudinal sectional views, respectively, of plasma processing apparatuses according to a second example embodiment.

In each of these plasma processing apparatuses, cathode electrodes 2 and anode electrodes 4 are vertically stacked. Discharge surfaces of the cathode electrodes 2 are oriented in the same direction (a surface of the cathode electrode 2 facing the anode electrode 4 is oriented in a downward direction in FIG. 3, and an upward direction in FIG. 4), and located generally horizontally. Anode and cathode electrode pairs 7 are provided in series equidistantly.

These configurations are disadvantageous in that it is difficult to secure a RF power wave-guiding path. Nevertheless, since the substrates 1 can be disposed horizontally, the substrates 1 can be advantageously sufficiently grounded and a potential distribution in plane of each substrate 1 can be advantageously minimized.

FIG. 3 depicts an example (of a plasma film forming apparatus) in which each substrate 1 is disposed on an upper surface of each anode electrode 4. The materials, structures, and arrangement distances (relationship between the distances A and B) of the cathode electrodes 2 and the anode electrodes 4 are the same as those according to the first embodiment shown in FIG. 1. For example, the plurality of cathode and anode electrode pairs have an empty space between the adjacent cathode and anode electrode pairs.

In the plasma processing apparatus thus configured, the material gas is filled up into a gap between each cathode electrode 2 and each anode electrode 4 at a predetermined flow rate and a predetermined pressure, and a RF power is applied to the cathode electrode 2 and the anode electrode 4, thereby producing a glow discharge region (plasma discharge region) between the cathode electrode 2 and the anode electrode 4. As a result, an amorphous film or a crystalline film can be formed on each substrate 1.

More specifically, by using the $SiH_4$ gas diluted with $H_2$ as the material gas, a silicon thin film having a thickness of 300 nm can be deposited in a range from −10% to 10% of a thickness distribution.

FIG. 4 depicts an example (of a plasma etching apparatus) in which each substrate 1 is disposed on an upper surface of each cathode electrode 2. The materials, structures, and arrangement distances (relationship between the distances A and B) of the cathode electrodes 2 and the anode electrodes 4 are the same as those according to the first embodiment shown in FIG. 2.

As a result of thus configuring the apparatus, a silicon film on each substrate 1 can be etched at an etch rate equal to or higher than 10 nm/s. It is thereby possible to obtain the plasma processing apparatus capable of preventing plasmas from interfering with one another even if a plurality of plasmas are present within one chamber. In addition, dry etching can be efficiently performed on a plurality of films.

According to the plasma processing apparatus according to the second embodiment, similarly to the effect of the plasma processing apparatus according to the first embodiment, it is possible to obtain a plasma processing apparatus capable of preventing plasmas from interfering with one another even if a plurality of plasmas are present within one chamber.

Third Embodiment

Figure 5:
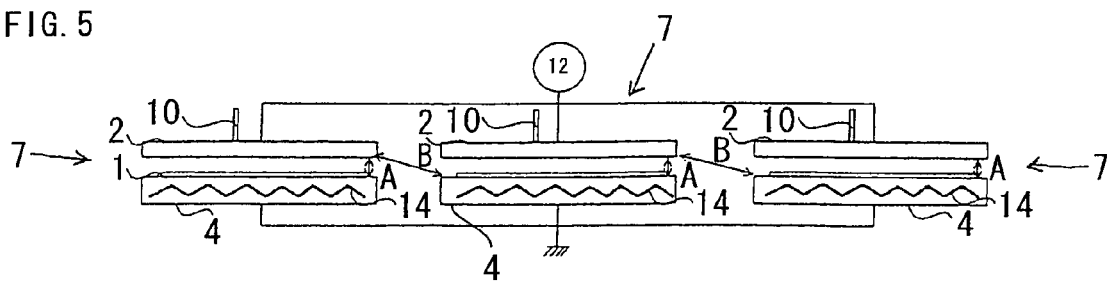
FIG. 5 is a schematic longitudinal sectional view and a schematic plan view of a plasma processing apparatus (with anodes grounded) according to a third example embodiment.
Figure 5:
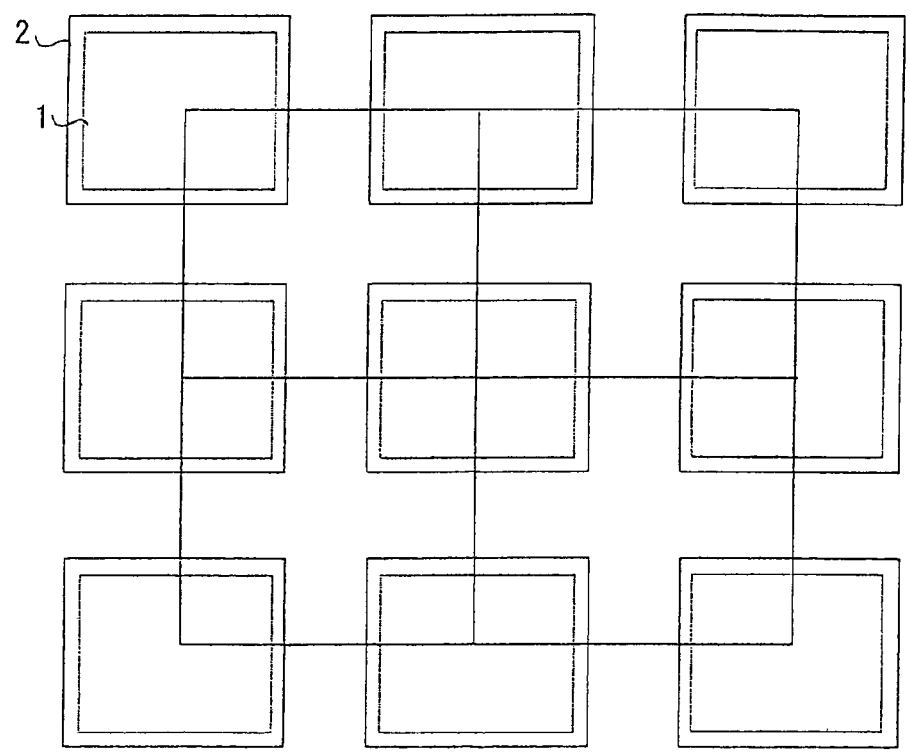
Figure 6:
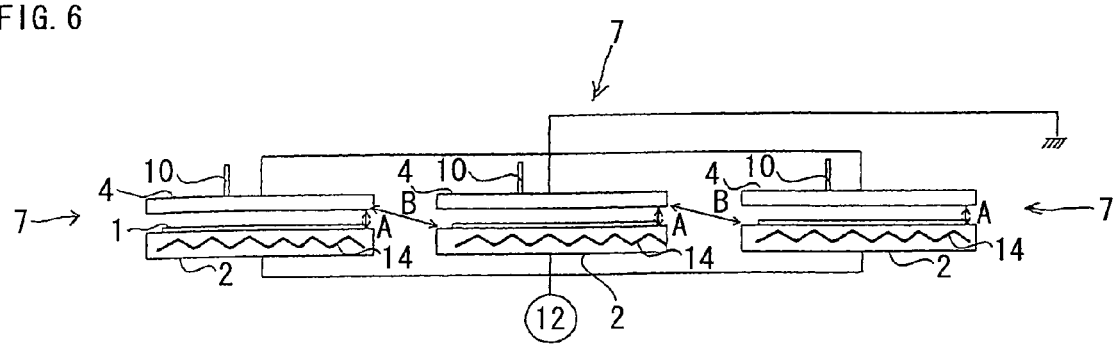
FIG. 6 is a schematic longitudinal sectional view and a schematic plan view of a plasma processing apparatus (with cathodes grounded) according to the third example embodiment.
Figure 6:
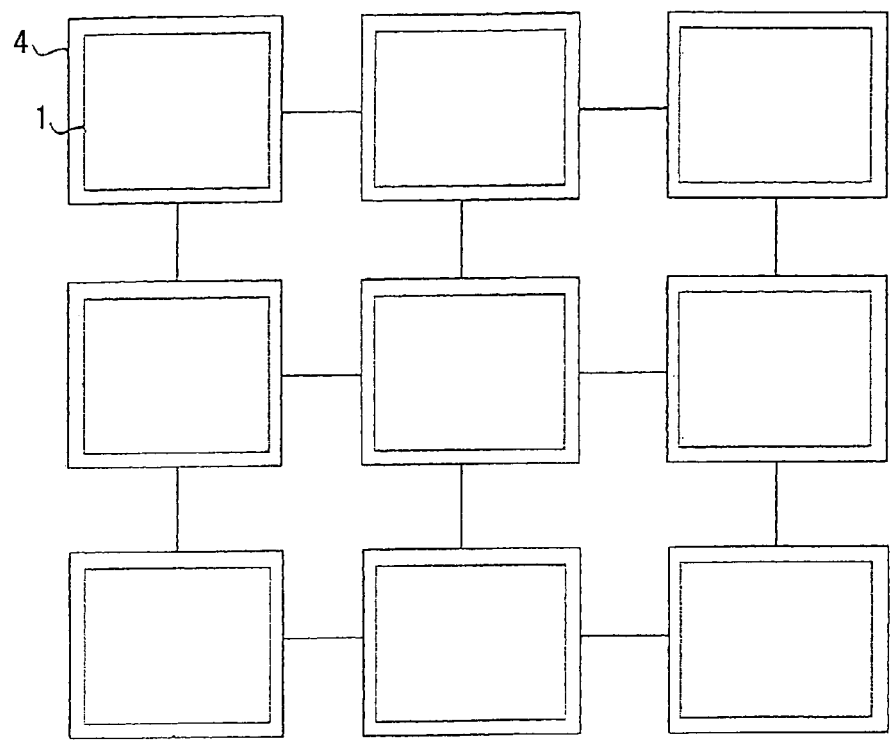
Figure 7:
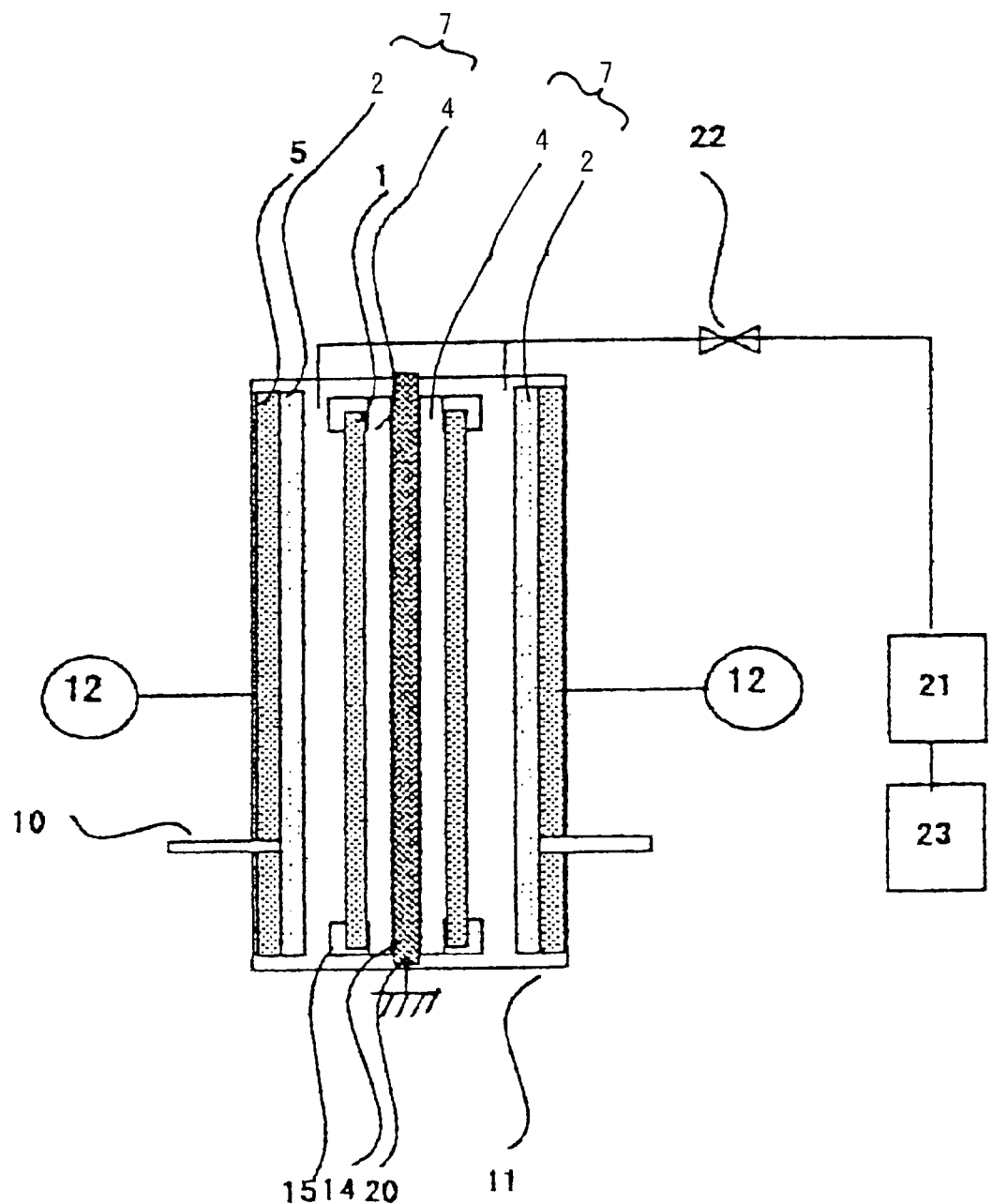
FIG. 7 is a schematic longitudinal sectional view of a conventional semiconductor device manufacturing apparatus.

FIGS. 5 and 6 are schematic longitudinal sectional views and schematic plan views, respectively, of plasma processing apparatuses according to a third example embodiment.

In a plurality of cathode and anode electrode pairs 7 shown in FIG. 5, cathode electrodes 2 and anode electrodes 4 are located on the same planes, respectively, and the cathode electrodes 2 are located at upper side relative to the anode electrodes 4. The anode and cathode electrode pairs 7 are provided generally horizontally and in parallel equidistantly.

The materials and structures of each cathode electrode 2 and each anode electrode 4 are the same as those according to the first embodiment. However, differently from the first embodiment, gas inlet tubes 10 are provided to be orthogonal to the cathode electrodes 2 or anode electrodes 4, respectively.

In the cathode and anode electrode pairs 7 shown in FIG. 5, taking two cathode and anode electrode pairs 7 adjacent to each other, a distance B between the cathode electrode 2 of one of the cathode and anode electrode pair 7 and the anode electrode 4 of the adjacent the cathode and anode electrode pair 7 is twice as large as a distance A between the cathode electrode 2 and the anode electrode 4 of each cathode and anode electrode pair 7. In an example of FIG. 6, taking two cathode and anode electrode pairs 7 adjacent to each other, a distance B between the anode electrode 4 of one of the cathode and anode electrode pair 7 and the cathode electrode 2 of the adjacent the cathode and anode electrode pair 7 is twice as large as a distance A between the cathode electrode 2 and the anode electrode 4 of each cathode and anode electrode pair 7.

In each of these plasma processing apparatuses, power can be easily applied from a rear side of the cathode electrodes 2 (from an upper side in FIG. 5 and a lower side in FIG. 6). The plasma processing apparatus can be, therefore, advantageously, easily configured only by providing a wave-guiding path in the air. In addition, each plasma processing apparatus is advantageous in that it is difficult to cause a spatial difference among the cathode electrodes 2. Besides, since the substrates 1 can be disposed horizontally, the substrates 1 can be advantageously sufficiently grounded and a potential distribution in plane of each substrate 1 can be advantageously minimized.

The plasma processing apparatuses according to the third embodiment can exhibit the same advantages as those of the plasma processing apparatuses according to the first embodiment. Namely, even if a plurality of plasmas are present within one chamber, it is possible to prevent the plasmas from interfering with one another.

In the plasma processing apparatus shown in FIG. 5, the cathode electrodes 2 and the anode electrodes 4 are provided on the same plane. Each substrate 1 is disposed on each anode electrode 4. The plasma processing apparatus functions as a film forming apparatus configured so that a heater 14 is included in each anode electrode 4 and so that a gas inlet tube 10 is provided in each cathode electrode 2 similarly to the plasma processing apparatuses shown in FIGS. 1 to 3.

In the plasma processing apparatus thus configured, the material gas is filled up into a gap between each cathode electrode 2 and each anode electrode 4 at a predetermined flow rate and a predetermined pressure, and a RF power is applied to the cathode electrode 2 and the anode electrode 4, thereby producing a glow discharge region (plasma discharge region) between the cathode electrode 2 and the anode electrode 4. As a result, an amorphous film or a crystalline film can be formed on each substrate 1.

More specifically, by using the $SiH_4$ gas diluted with $H_2$ as the material gas, a silicon thin film having a thickness of 300 nm can be deposited in a range from −10% to 10% of a thickness distribution.

In this embodiment, similarly to the preceding embodiments, the distance A, which is a discharge distance, and the distance B between one cathode electrode 2 and the other anode electrode 4 in the anode and cathode electrode pairs 7 adjacent to each other satisfy the relationship of $B \geq 2A$. Due to this, the plasma processing apparatus can exhibit the same advantages as those according to preceding embodiments. Namely, even if a plurality of plasmas are present within one chamber, it is possible to prevent the plasmas from interfering with one another.

The plasma processing apparatus shown in FIG. 6 functions as an etching apparatus configured so that each substrate 1 is disposed on each cathode electrode 2. In addition, the distance A, which is a discharge distance, and the distance B between one cathode electrode 2 and the other anode electrode 4 in the anode and cathode electrode pairs 7 adjacent to each other satisfy the relationship of $B \geq 2A$.

As a result of thus configuring the apparatus, similarly to the first embodiment, a silicon film on each substrate 1 can be etched at an etch rate equal to or higher than 10 nm/s. It is thereby possible to obtain the plasma processing apparatus capable of preventing plasmas from interfering with one another even if a plurality of plasmas are present within one chamber. In addition, dry etching can be efficiently performed on a plurality of films.

According to the present invention, a semiconductor device such as a solar battery, a TFT, a photosensitive body or the like using a semiconductor thin film or an optical thin film can be efficiently obtained at low cost.

What is claimed is:

1. A plasma processing apparatus comprising:
   a sealable chamber that is sealable;
   a gas supply section that supplies a reactive material gas into the chamber; and
   a plurality of cathode and anode electrode pairs provided within the chamber, the electrode pairs being connected to an external power supply and configured to produce plasma discharges through the material gas, respectively, wherein
   the plurality of cathode and anode electrode pairs are provided at a distance from one another at which the plasma discharges are prevented from interfering with one another, and have an empty space between the adjacent cathode and anode electrode pairs;
   a processing target is disposed between a cathode electrode and an anode electrode in each cathode and anode electrode pair, and subjected to a plasma discharge processing;
   a distance between the cathode electrode and the anode electrode in the each anode and cathode electrode pair is a predetermined distance, and a distance between a cathode electrode of one of the anode and cathode electrode pairs and an anode electrode of an anode and cathode electrode pair adjacent to the one of the anode and cathode electrode pairs is at least twice as large as the predetermined distance.

2. The plasma processing apparatus according to claim 1, wherein the plurality of cathode and anode electrode pairs are disposed in a manner that an anode electrode and a cathode electrode in each anode and cathode electrode pair are in a form of plates and in parallel to each other, and that discharge surfaces of cathode electrodes in the respective anode and cathode electrode pairs are oriented in a same direction.

3. The plasma processing apparatus according to claim 2, wherein
   the plurality of anode and cathode electrode pairs are disposed in series with the discharge surfaces of the cathode electrodes located generally perpendicularly to a bottom of the chamber.

4. The plasma processing apparatus according to claim 2, wherein
   the plurality of anode and cathode electrode pairs are disposed in series with the discharge surfaces of the cathode electrodes located generally horizontally and the cathode electrodes located at an upper side relative to the anode electrodes.

5. The plasma processing apparatus according to claim 4, wherein
   a substrate, which is a processing target, is mounted on an upper surface of each anode electrode.

6. The plasma processing apparatus according to claim 2, wherein
   the plurality of anode and cathode electrode pairs are disposed in series with the discharge surfaces of the cathode electrodes located generally horizontally and the cathode electrodes located at a lower side relative to the anode electrodes.

7. The plasma processing apparatus according to claim 6, wherein
   a substrate, which is a processing target, is mounted on an upper surface of each cathode electrode.

8. The plasma processing apparatus according to claim 2, wherein
   the plurality of anode and cathode electrode pairs are disposed in parallel with the discharge surfaces of the cathode electrodes located generally horizontally, the cathode electrodes located at an upper side relative to the anode electrodes, and the cathode electrodes and the anode electrodes located on the same planes, respectively.

9. The plasma processing apparatus according to claim 2, wherein the plurality of anode and cathode electrode pairs are disposed in parallel with the discharge surfaces of the cathode electrodes located generally horizontally, the cathode electrodes located at a lower side relative to the anode electrodes, and the cathode electrodes and the anode electrodes located on the same planes, respectively.

10. The plasma processing apparatus according to claim 2, wherein
said predetermined distance is in a range from several millimeters to several tens of millimeters.

11. The plasma processing apparatus according to claim 1 wherein an interior of the cathode electrode is a cavity so that the material gas is introduced into the cavity, and many through holes for supplying the material gas to a surface of said substrate are formed on one surface of the cathode.

12. The plasma processing apparatus according to claim 1, wherein the plasma processing apparatus is to form an amorphous film or a crystalline film on said substrate.

13. The plasma processing apparatus according to claim 1, wherein the anode electrode is formed of aluminum alloy, and includes therein a heater.

* * * * *